US012791615B2

(12) United States Patent
Dehghan-Azad et al.

(10) Patent No.: US 12,791,615 B2
(45) Date of Patent: Nov. 10, 2026

(54) FAULT DETECTION IN AN ELECTRIC DRIVE TRAIN OF A VEHICLE

(71) Applicant: Motion Applied Limited, Woking (GB)

(72) Inventors: Ehsan Dehghan-Azad, Woking (GB); Tak Cheung Sze, Woking (GB)

(73) Assignee: Motion Applied Limited, Woking (GB)

( * ) Notice: Subject to any disclaimer, the term of this patent is extended or adjusted under 35 U.S.C. 154(b) by 0 days.

(21) Appl. No.: 19/126,922

(22) PCT Filed: Nov. 10, 2023

(86) PCT No.: PCT/GB2023/052954
§ 371 (c)(1),
(2) Date: May 2, 2025

(87) PCT Pub. No.: WO2024/100419
PCT Pub. Date: May 16, 2024

(65) Prior Publication Data
US 2026/0002996 A1 Jan. 1, 2026

(30) Foreign Application Priority Data
Nov. 11, 2022 (GB) ..................................... 2216901

(51) Int. Cl.
*G01R 31/34* (2020.01)
*B60L 3/00* (2019.01)
(Continued)

(52) U.S. Cl.
CPC ............ *G01R 31/346* (2013.01); *B60L 3/003* (2013.01); *B60L 15/007* (2013.01);
(Continued)

(58) Field of Classification Search
CPC .... G01R 31/346; G01R 31/006; G01R 31/42; B60L 3/003; B60L 15/007; H02P 23/14; H02P 27/08
See application file for complete search history.

(56) References Cited

U.S. PATENT DOCUMENTS 5,481,194 A 1/1996 Schantz et al.
2011/0181104 A1 7/2011 Kamaga
(Continued)

FOREIGN PATENT DOCUMENTS

DE 102021200414 A1 7/2022
EP 1995870 A1 11/2008
(Continued)

OTHER PUBLICATIONS

International Search Report and Written Opinion in International Appln. No. PCT/GB2023/052954, mailed on Feb. 15, 2024, 24 pages.
(Continued)

*Primary Examiner* — Paresh Patel
(74) *Attorney, Agent, or Firm* — Fish & Richardson P.C.

(57) ABSTRACT

A power inverter for an electric drive chain of a vehicle, comprising: a first electrical path connectable to a high voltage source and a low voltage source; a second electrical path that is connectable to the first electrical path and also capable of being electrically isolated from the first electrical path; and a test unit configured to determine an indication of a potential difference between the first and second electrical paths; the power inverter being configured to have two modes of operation: an operational mode in which the first electrical path is connected to the high voltage source and the power inverter is configured to provide current to an electric motor of the vehicle; and a test mode in which the first electrical path is connected to the low voltage source and the test unit is configured to determine, from the
(Continued)

indication of the potential difference between the first and second electrical paths, whether there is a fault in an electrical connection in the vehicle.

20 Claims, 3 Drawing Sheets

(51) Int. Cl.

| | |
|---|---|
| ***B60L 15/00*** | (2006.01) |
| ***G01R 31/00*** | (2006.01) |
| ***G01R 31/42*** | (2006.01) |
| ***H02P 23/14*** | (2006.01) |
| ***H02P 27/08*** | (2006.01) |

(52) U.S. Cl.
CPC ........... *G01R 31/006* (2013.01); *G01R 31/42* (2013.01); *H02P 23/14* (2013.01); *H02P 27/08* (2013.01)

(56) References Cited

U.S. PATENT DOCUMENTS

2020/0307383 A1 10/2020 Fukui
2021/0129675 A1 5/2021 Isaksson
2023/0356596 A1* 11/2023 Pfeilschifter ............. B60L 3/12

FOREIGN PATENT DOCUMENTS

GB 2623134 B 12/2024
WO WO 2024/100419 A1 5/2024

OTHER PUBLICATIONS

Search Report in United Kingdom Appln. No. 2216901.5, mailed on May 3, 2023, 3 pages.

* cited by examiner

FAULT DETECTION IN AN ELECTRIC DRIVE TRAIN OF A VEHICLE

CROSS-REFERENCE TO RELATED APPLICATIONS

The present application is the national stage entry of International Application No. PCT/GB2023/052954, filed on Nov. 10, 2023, which claims priority to Application No. GB2216901.5, filed in the United Kingdom on Nov. 11, 2022, the disclosures of which are expressly incorporated herein in their entirety by reference thereto.

FIELD OF THE INVENTION

This invention relates to an electric drive train for a vehicle, in particular to the detection of faults such as isolation faults or faults in the windings of an electric motor.

BACKGROUND

It is common to use a battery such as a DC traction battery, to provide energy to an electric motor, for example in an electric vehicle. Typically, a traction battery produces a voltage which can range from the order of 250V to what could be considered a high voltage of around 400V or 800V. The current supplied to the electric motor by such a traction battery is called the DC link current. Typically, the DC link current is supplied via an inverter circuit, which supplies three-phase current to windings of the motor.

Ordinarily, faults would become apparent in use when the motor is attempted to be operated. However, this can be dangerous. Traditional methods of fault detection, such as a high-voltage interlock loop (HVIL), can only detect connector disconnection and cannot detect a motor or cabling fault.

To meet the latest functional safety requirements, diagnostics of faults within the electric drive train of an electric vehicle are required.

It would therefore be desirable to provide a means of detecting of faults on the motor or the connection to the motor by the inverter.

SUMMARY OF THE INVENTION

According to one aspect there is provided a power inverter for an electric drive train of a vehicle, comprising: a first electrical path connectable to a high voltage source and a low voltage source; a second electrical path that is connectable to the first electrical path and also capable of being electrically isolated from the first electrical path; and a test unit configured to determine an indication of a potential difference between the first and second electrical paths; the power inverter being configured to have two modes of operation: an operational mode in which the first electrical path is connected to the high voltage source and the power inverter is configured to provide current to an electric motor of the vehicle; and a test mode in which the first electrical path is connected to the low voltage source and the test unit is configured to determine, from the indication of the potential difference between the first and second electrical paths, whether there is a fault in an electrical connection in the vehicle.

Electrically isolated means that the first and second electrical paths are physically separated in a way that substantially inhibits current flow between the two. For example, they might be separated by an open switch, a disconnection between adjacent motor coils or an air gap, such as that which would be expected between the low voltage and high voltage grounds on the vehicle.

The second electrical path is a route through the circuit of the power inverter and/or other parts of the vehicle, for example the electric motor. The components comprised within the second electrical path may vary depending on the fault being detected by the test unit. The first electrical path may comprise electrical contacts for connecting the first electrical path to the high voltage source.

In the test mode, the first electrical path may not be connected to the high voltage source. If the test unit determines, in the test mode, that there is not a fault in an electrical connection in the vehicle, the power inverter may be figured to connect the first electrical path to the high voltage source (i.e. transition from the test mode to the operational mode).

The test unit may be configured to determine, from the indication of the potential difference between the first and second electrical paths, whether the first and second electrical paths are electrically isolated from each other.

The fault may be an isolation fault between one or more components of the vehicle powered by the high voltage source and one or more components of the vehicle powered by the low voltage source.

The test unit may comprise a current sensor. The test unit may be configured to determine an indication of a potential difference between the first and second electrical paths by measuring current flow in one or both of the first and second electrical paths.

The electric motor may comprise multiple windings. The power inverter may comprise multiple electric switching devices each connectable to a winding of the electric motor.

In the test mode, each of the multiple electric switching devices may be in an open configuration. This may allow the test unit to determine whether the first and second electrical paths are electrically isolated from each other.

The power inverter may be configured to, in the test mode: close a pair of the multiple electric switching devices; determine an indication of a potential difference between the first and second electrical paths; and determine, from the indication of the potential difference between the first and second electrical paths, the presence of a fault in one or more windings of the electric motor.

The power inverter may be configured to keep the other electric switching devices of the multiple electric switching device in an open configuration when the pair of the multiple electric switching devices are closed.

Each winding of the motor may be connectable to a respective first switch and a respective second switch of the multiple electric switching devices.

The multiple electric switching devices may comprise a first subset of switches and a second subset of switches.

For a respective winding of the motor, the respective first switch may be one of the first subset of switches and the respective second switch may be one of the second subset of switches.

The pair of switches may comprise one switch of the first subset of switches and one switch of the second subset of switches. The one switch of the first subset of switches may be connected to a first winding of the electric motor and the one switch of the second subset of switches may be connected to a second winding of the electric motor.

The fault may be a fault in one or more of the first winding and the second winding.

The power inverter may be further configured to, in the test mode: open the pair of switches; close a different pair of the multiple electric switching devices to the pair of the multiple electric switching devices; determine an indication of a potential difference between the first and second electrical paths; and determine, from the indication of the potential difference between the first and second electrical paths, the presence of a fault in one or more windings of the electric motor.

At least one of the different pair of the multiple electric switching devices may be a different electric switching device to the one switch of the first subset of switches and/or the one switch of the second subset of switches.

The power inverter may be configured to, if the test unit determines the presence of fault in one or more windings of the motor, prevent the connection of the first electrical pathway to the high voltage electric energy store (i.e. prevent the power inverter from transitioning from the test mode to the operational mode).

The power inverter may comprise multiple gate drivers, each gate driver being configured to drive a respective electric switching device of the multiple electric switching devices.

The test unit may comprise a sensor configured to measure the potential difference between the first and second electrical paths.

The high voltage electric energy store may be configured to supply a voltage of greater than 60 V. For example, the high voltage source may be configured to supply a voltage of 400 V or 800 V.

The high voltage source may be a DC traction battery.

The low voltage source may be configured to supply a voltage of less than 60 V. For example, the low voltage source may be configured to supply a voltage of 20 V. The low voltage source has a relatively lower voltage compared to the voltage of the high voltage source. The low voltage source and the high voltage source may be configured to supply a DC voltage.

The power inverter may comprise one or more paths via which the potential difference can be applied from the low voltage source between the first electrical path and the second electrical path.

The power inverter may be configured to first operate the in the test mode and transition to the operational mode if, when operating in the test mode, the test unit determines that there is not a fault in an electrical connection in the vehicle.

The second electrical path may vary depending on which switching devices are open and which are closed and the type of fault in the vehicle (for example, whether there is an isolation fault in the vehicle or a fault in a winding of the motor).

The electrical fault may be or may cause low voltage and high voltage grounds of the vehicle being connected.

The test unit may be a voltage monitor. The test unit may be an isolation monitor. The isolation monitor may be configured to determine a fault in an electrical connection of the vehicle when it determines that the low voltage and high voltage grounds of the vehicle are connected.

Where the test unit is an isolation monitor, the isolation monitor may be configured to test electrical separation between the high and low voltage grounds of the vehicle. If the high and voltage grounds are correctly separated, no current will flow between the first and second electrical paths. If a fault has occurred, and the two grounds have an electrical path between them, a current will flow between the first and second electrical paths, discharging the low voltage across the capacitor. The isolation monitor may be configured to detect this current and determine that a fault has occurred whereby the high and low voltage grounds are electrically connected to each other.

In one embodiment, first and second paths with the inverter circuit may be connected to the isolation monitor, and the second path is connected to the high voltage ground. The high voltage ground and low voltage ground should be kept separate, but if they are connected due to some fault, the first and second paths are connected and a current will flow.

The power inverter may comprise a controller configured to perform the steps described above.

According to a further aspect, there is provided a vehicle comprising a low voltage electric energy store, an electric motor, a high voltage electric energy store and the power inverter having any of the features described above.

BRIEF DESCRIPTION OF THE FIGURES

The present invention will now be described by way of example only, with reference to the accompanying drawings, in which.

DETAILED DESCRIPTION

The current subject matter relates to a drive train suitable for an electric powered vehicle. The drive train includes an inverter circuit for use with one or more electric energy sources, such as a battery. For example, the battery may be a DC traction battery commonly used in electric vehicles. Such a battery may be used as the traction source to drive one or more electric motors to propel an electric or hybrid vehicle such as a car. A trend in such traction batteries is for them to produce energy at a high voltage, of the order of 800V. A voltage of this magnitude is beneficial for producing a suitably high power for driving the motors. However, such voltages can be dangerous if there is a fault in the system which the battery is connected.

Figure 1:
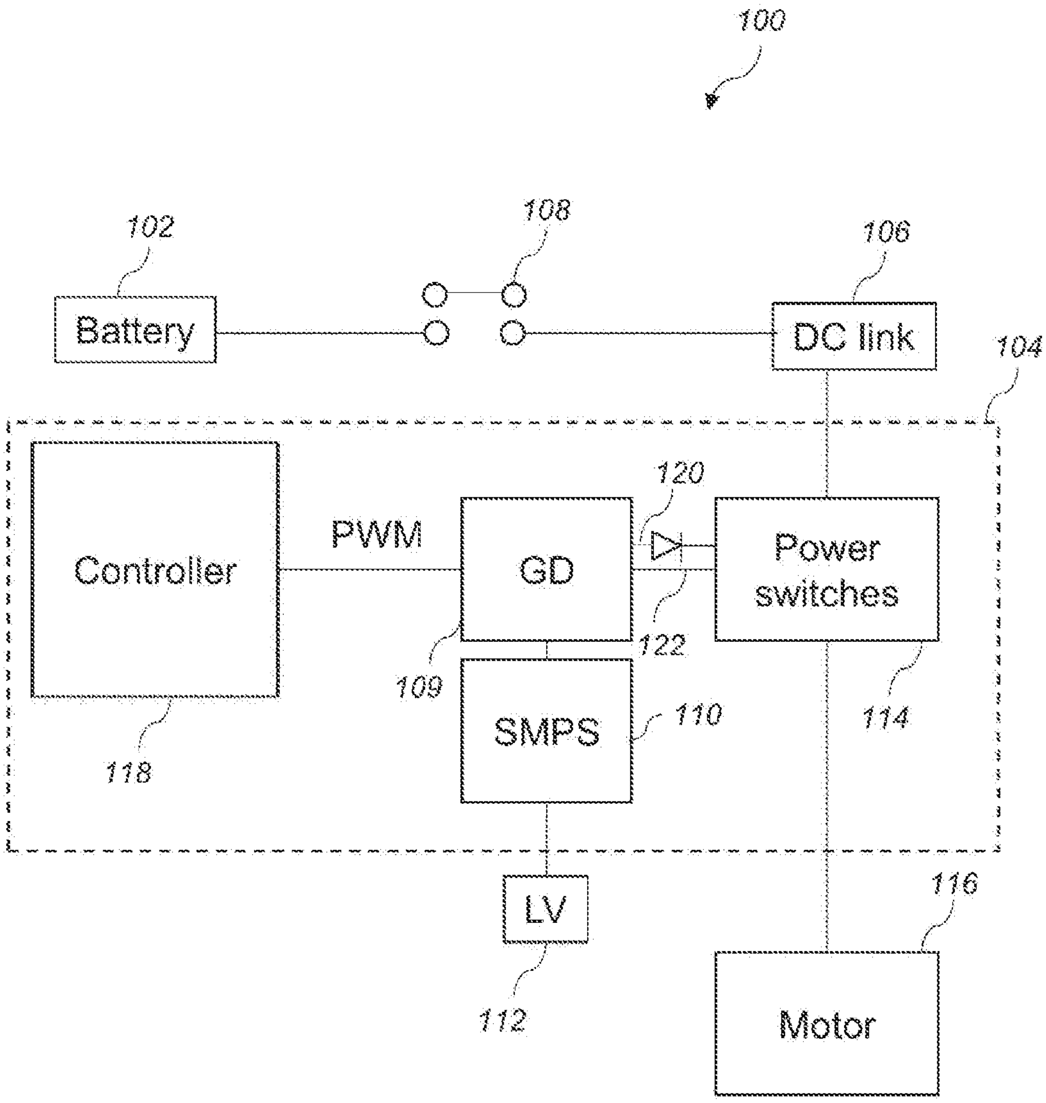
FIG. 1 shows a basic circuit diagram schematically illustrating the components of an electric drive train.

A schematic example of an electric drive train system is shown in FIG. 1. The principle components of the system 100 are a battery 102 which is connected to a power inverter 104 by a DC link 106. The battery 102 is a high voltage electric energy source. Between the battery 102 and the DC link 106 are contacts 108 for connecting the battery 102 to the DC link 106. In FIG. 1, the contacts 108 are shown in the open position, where the battery 102 is not electrically connected to the inverter 104. The contacts may be driven to close by controller 118 or another controller of the vehicle. When the contacts are closed, the battery 102 is electrically connected to the inverter 104.

The inverter 104 comprises multiple gate drivers, indicated collectively at 109, which can be driven from a switched-mode power supply (SMPS) 110 powered by a low voltage power supply (LV) 112, which is a low voltage electric energy source. The gate drivers are each used to control respective power switches, collectively indicated at 114. One gate driver may control one power switch. The motor is indicated at 116.

A controller 118 may be part of the power inverter, as shown in FIG. 1, or may be external to power inverter. One function the controller is to manage the flow of electrical energy delivered by the battery, controlling the speed of the motor and the torque it produces. In this example, the signal from the controller to the gate drivers is pulse width modulated (PWM). The controller controls the operation of switches 114 via the gate drivers 109.

As mentioned above, the battery 102 may be a DC traction battery. For example, such a battery may be used as the traction source to drive the electric motors to propel an electric or hybrid vehicle such as a car. However, it is common for the energy from such a battery to be additionally used to drive other components of the vehicle, such as the lights, air conditioning units etc. Battery 102 may produce energy at a high voltage, of the order of 800V. A voltage of this magnitude is beneficial for producing a suitably high power for driving the motors. On the other hand, the other components might need to operate at a lower voltage. One or more converters may be used in the system to convert the voltage from the battery to a voltage suitable for use in the one or more other components.

The power inverter 104 is configured to convert the DC power supplied by the battery 102 to AC for supply to the motor 116. In this example, the motor is an AC motor.

As discussed above, the gate drivers 109 can be powered by a SMPS 110 powered by a low voltage power supply 112. The low voltage supply may for example provide a voltage of 18V. Without the HV battery supply 102 connected (i.e. with the battery contact 108 open) the DC link can be pre-charged to a low voltage through a sneak path via a switch mode power supply (SMPS) 110 for powering gate driver (GD) circuitry 109. The sneak path is indicated at 120. The sneak path 120 may comprise a diode to allow current to flow in one direction only. 122 is a reference path. The low voltage supply 112 can charge a capacitor of the DC link (not shown in FIG. 1) via the sneak path.

The power switch controls can be actuated to provide low voltage power to the motor before the HV power supply 102 is connected. As will be described in more detail below, when the LV supply 112 is turned on, a low voltage can be measured across the DC link. By actuating different ones of the switches 114 and by measuring the voltage on the DC link, it is possible to detect whether a motor is electrically connected to the inverter, or to detect faults in the motor 116 and/or the connection to the motor 116 by the inverter 104.

Figure 2:
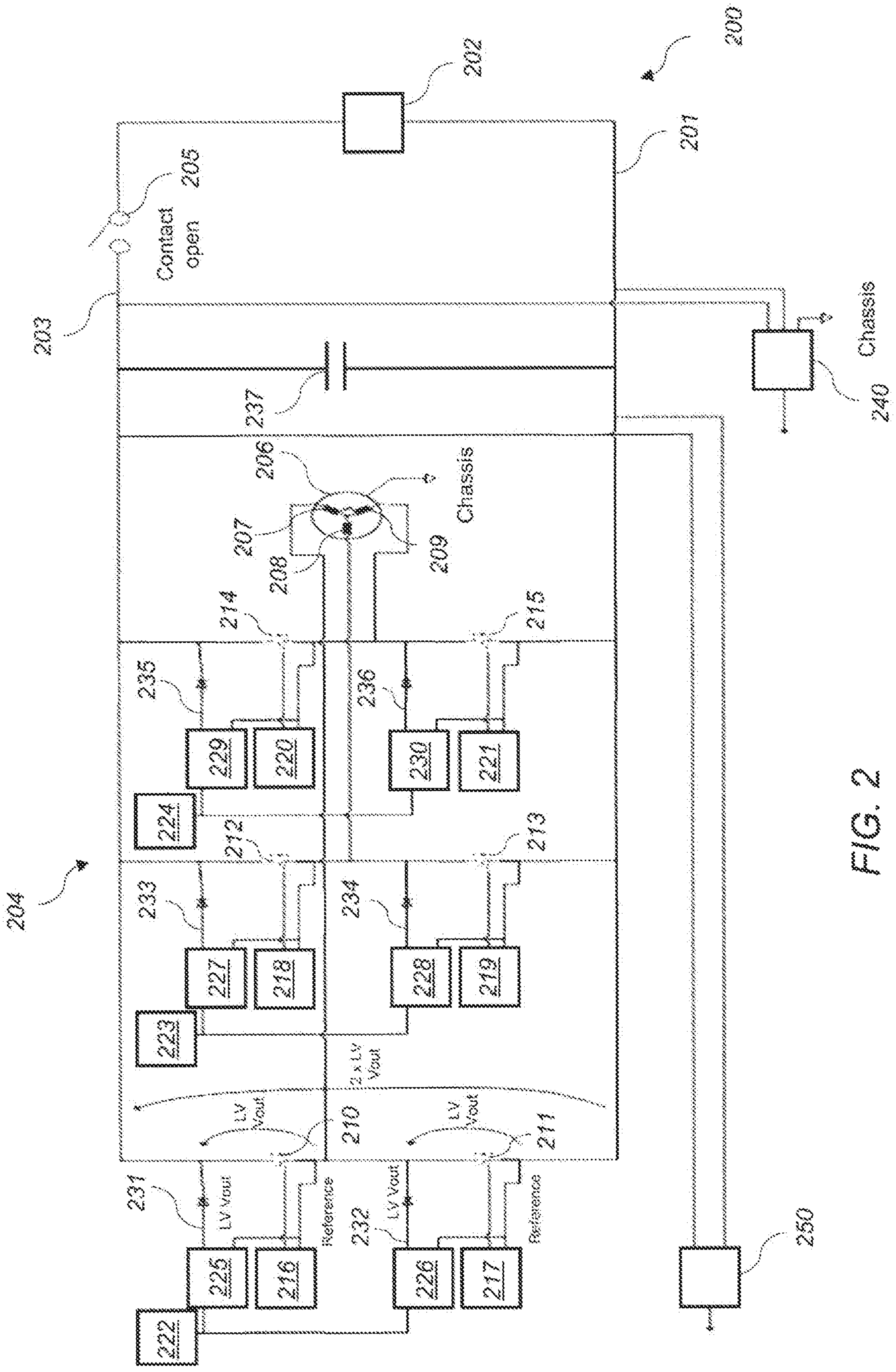
FIG. 2 shows a more detailed circuit diagram schematically illustrating the components of an electric drive train.

FIG. 2 shows a circuit diagram for such a system, with the components shown in more detail.

The principle components of the system 200 are a high voltage source in the form of a battery 202, connectable to a motor 206 via an inverter circuit 204. The inverter circuit comprises a rail 201 connectable to the battery 202. The rail 201 is also connectable to one or more low voltage power supplies. A lower rail 203 is also connectable to the battery 202 and the low voltage power supplies. The battery can therefore be connected to the motor via a DC link. Contacts are shown at 205 between the DC link and the battery 202. In FIG. 2, the contacts 205 are shown in the open state, but can be closed to allow current to flow from the battery 202 to the motor 206. As in the system 100, the battery 202 produces a high voltage, such as a voltage of around 800V for example for driving one or more electric motors of a vehicle, such as motor 206.

There are generally two reference ground terminals in the drive train system. The reference grounds are reference points in the circuit from which voltages are measured. One is the chassis low voltage ground terminal. As indicated in FIG. 2, the motor 206 is grounded to the low voltage ground terminal. Isolation monitor 240 shown in FIG. 2 is also grounded to the low voltage ground terminal. The other ground is a high voltage reference ground for the rail 201 in FIG. 2. The chassis low voltage ground can act as a ground for the low voltage part of the system that powers, for example, the headlights and audio-visual components of the vehicle and the high voltage ground can act as a ground for the high voltage part of the system that is powered by a high voltage electric energy store (such as high voltage battery 202).

Motor 206 is grounded to the low voltage ground terminal (for example, the chassis of the vehicle). In this example, the motor 206 is a three-phase induction motor having three windings 207, 208, 209. The windings 207, 208, 209 are each wound around a core. When electrical power is supplied to the windings, each respective core is magnetised and drives rotors of the motor. In a similar way to the system 100, one purpose of the inverter circuit 204 is to convert the DC voltage provided by the battery 202 to an AC voltage for supply to the windings of the motor.

The current in each winding is 120 degrees out of phase with the current in the other windings. The windings may be internally connected. The windings may, in proper operation, be isolated from the motor casing and the chassis. The windings are electrically connected to the inverter. The windings receive a current from the battery 202, via the inverter, when the contact 205 is closed. The motor 206 may have three high voltage terminals to which the battery 202 is connected when contact 205 is closed. When the contact 205 is open, the windings may receive a current from low voltage power supplies in the system, as will be described in more detail below.

Such windings may develop faults which can affect the performance of the motor and cause safety concerns. Faults in the windings may include low resistance, which is caused by the degradation of the insulation of the windings due to conditions such as overheating, corrosion or physical damage. This can lead to insufficient isolation between the conductors or motor windings, which can cause leakages and open circuits, and eventually motor failure. Faults may also be caused by overheating.

In the example shown in FIG. 2, the inverter comprises MOSFET transistor switches labelled 210, 211, 212, 213, 214 and 215. It will be appreciated that other types of transistors could be used, such as bipolar transistors. Other types of electrical switches may also be used. In an arrangement such as that of FIG. 2, the transistors are typically based on high voltage MOSFETS such as silicon carbide (SiC) MOSFETS using SiC as the semi-conductor material. However, lower voltage rated devices such as GaN MOSFETS, or other low voltage transistors such as low voltage MOSFETS, may alternatively be used depending on the voltage output of the battery.

The switches are driven by respective signals applied to their gates via respective gate drivers (GD). The signals may be pulse width modulated (PWM) signals. The signals can drive the switches to open and close.

Switches 210 and 211 are each electrically connected to winding 207. Switches 212 and 213 are each electrically connected to winding 208. Switches 214 and 215 are each electrically connected to winding 209.

In the example shown in FIG. 2, low voltage power supplies 222, 223, 224 power isolated auxiliary supplies in the system. Low voltage supply 222 is connected to Isolated auxiliary supplies 225 and 226. Low voltage supply 223 is connected to isolated auxiliary supplies 227 and 228. Low voltage supply 224 is connected to isolated auxiliary supplies 229 and 230. When the low voltage power supplies are electrically connected to the inverter circuit, the isolated auxiliary supplies provide an isolated low voltage to the inverter relative to the high voltage (HV) battery 202. For example, the isolated auxiliary supplies may provide a voltage of 20V, whereas the HV supply may provide a voltage of 400 or 800V.

Each isolated auxiliary supply is configured to supply a low voltage to the DC link rail 203 between the battery and the motor via a sneak path, such as that indicated at 231 from isolated auxiliary supply 225. The other isolated auxiliary supplies 226, 227, 228, 229 and 230 have corresponding sneak paths 232, 233, 234, 235, 236 respectively to allow a low voltage to be applied across the DC link rail 203 and the ground 201. This voltage is indicated in FIG. 2 as LV Vout. There may be some voltage leakage from a low voltage power supply to the GDs, so LV Vout may be equal to approximately 18V when using a 20V LV power supply at 222, 223 and 224. Therefore, the voltage on the DC link is expected to be approximately 30-40V (considered to be a low, safe voltage) when one or more of the low voltage supplies 222, 223 and 224 are connected to the inverter circuit with the multiple switches 210-215 open and when the battery 202 is not connected (for example, when contacts 205 are open). When one or more of the low voltage supplies 222, 223 and 224 are connected to the inverter and the multiple switches 210-215 are open, a capacitor 237 can be charged by the current flowing to the DC link via one or more of the sneak links 231-236.

Each sneak path link between a low voltage isolated auxiliary supply and the DC link may comprise a component that primarily conducts current in one direction, such as a diode. A further link between a respective gate driver and the DC link may be used as a reference. When a respective switch is actuated, a voltage of LV Vout can allow a corresponding current to flow onto the DC link as capacitor 237 discharges.

Switches 210, 211, 212, 213, 214 and 215 are driven by gate drivers 216, 217, 218, 219, 220 and 221 respectively. Each of the switches may be driven to open and close by their respective gate driver. A controller (not shown in FIG. 2) may provide PWM signals to the gate drivers, as described with respect to FIG. 1 above.

The switches comprise two subsets of switches. In the example shown in FIG. 2, a first subset of switches comprises switches 210, 212 and 214. Each switch in the first subset is connected to a different winding. A second subset of switches comprises switches 211, 213 and 215. Each switch in the second subset is connected to a different winding. Each winding 206, 207, 208 of the motor is connected to one switch in the first subset and one switch in the second subset. For example, winding 207 is connected to switches 210 and 211; winding 208 is connected to switches 212 and 213; and winding 209 is connected to switches 214 and 215.

The low voltage and high voltage parts of the system are preferably isolated to prevent electrocution. When contacts 205 are open and the rail 203 is not connected to the battery 202, there should preferably be no current flow between the high voltage part of the system (with the high voltage reference ground) and the low voltage part of the system (with the low voltage/chassis ground). Therefore, the current flow on the DC link when the contacts are open should be 0A.

Isolation monitor 240 can be used to detect isolation failures between the low voltage and the high voltage parts of the system. The isolation monitor 240 may be connected across the rails 201 and 203 of the DC link as shown in FIG. 2. The isolation monitor 240 may be configured to detect an isolation fault in the system before connection of the high voltage supply 202 to the inverter 204 (i.e. before contacts 205 are closed to connect the battery 202 to the inverter).

An isolation test can be performed by generating a low voltage (denoted in FIG. 2 as LV Vout) on the high voltage part of the inverter circuit via one or more of the sneak links 231-236, which act as respective leakage paths from one or more of the Isolated power supplies 225-230 respectively. In some implementations, LV Vout may be less than or equal to 20V. This is considered to be a ‘safe’ voltage that can be applied to the circuit without endangering the life of a user of the vehicle.

A potential difference is applied from one or more of the low voltage supplies 225-230 between the rail 201 and the rail 203 and the current flowing between the rails can be measured.

When one or more of the isolated power supplies 225, 226, 227, 229 and 230 are connected to the inverter and switches 210-215 are in the open position, if the isolation monitor 240 detects a leakage current, this indicates that there is an isolation fault between the low voltage part of the system and the high voltage part of the system.

If there is an isolation fault, the low voltage power supply will generate a leakage current between the high voltage ground side to the chassis low voltage ground side of the circuit, which can be measured by a current sensor in unit 240.

If the unit 240 measures a current of 0A, this indicates that there is no isolation fault. If the isolation monitor 240 detects a leakage current, this indicates that there is an isolation fault in the system. If the isolation monitor 240 detects an isolation fault, it can send a signal indicating an isolation fault to the controller of the inverter. In response to receiving a signal indicating an isolation fault, the controller may prevent the battery 202 from being connected to the inverter 204, for example by keeping the contacts 205 open and not connecting the rail 203 to the battery 202.

The unit 240 can therefore determine an indication of a potential difference between the rails 201 and 203. In this example, the unit determines an indication of a potential difference between the rails 201 and 203 by measuring current flow in the circuit and from this, determines whether there is an isolation fault. This may be performed when the power inverter is operating in a test mode. In the test mode, the rail 203 is not connected to the battery 202 and contacts 205 are open.

The system can also detect whether any of the motor windings are open and/or if there are any disconnection faults in the inverter circuit before connection to hazardous voltages (i.e. before connecting the inverter circuit to battery 202 by closing the contacts 205).

The connection to the motor could be broken by an open circuit or the disconnection of a motor-end connector. Likewise, one or more of the motor windings 207, 208, 209 could be open circuit due to a fault. These faults could be hazardous once the HV is applied from the battery and early diagnosis of the failure before application of the HV is desirable.

As will now be described, monitoring of the voltage on the DC link by the diagnostic unit 250 shown in FIG. 2 can be used to check for motor winding faults without the application of a high voltage from the battery 202. Therefore, the process described below can be performed with the battery contacts 205 open.

As mentioned above, a safe voltage level (indicated as LV Vout in FIG. 2) can be generated in the high voltage part of the circuit via the isolated power supplies 225-230, and the DC link can be charged to a safe voltage level via the sneak links, such as sneak link 231 from isolated power supply 225. In the circuit of FIG. 2, capacitor 237 can be charged as current flows from one or more of the isolated power supplies 225-30 to the DC link via one or more of the links 231-236. The capacitor 237 is connected to the rail 201 and the rail 203. Switches 210-216 may all be open at this. point.

A potential difference can be applied from a low voltage source between the rail 201 and the rail 203 of the inverter circuit. By closing combinations of the switches 210 to 215 and monitoring the voltage between the rail 201 and the rail 203 can be determined by the voltage diagnostic unit 250, a disconnection or opening of one or more of the motor windings can be detected.

For example, by closing switches 210 and 213 (and keeping the other switches 211, 212, 214, 215 open), a current is allowed to flow through windings 207 and 208. The voltage across the DC link would be expected to be shorted out if the motor windings 207 and 208 are connected, and the voltage diagnostic unit 250 will measure a voltage of 0V in this case due to discharge of the capacitor 237.

However, if there is a disconnection, such as a broken wire, in one of the windings 207 and 208, then the DC link voltage will not be shorted out and the DC link voltage diagnostic unit 250 will measure a voltage of greater than 0V across the DC link. The voltage diagnostic unit measuring a voltage of greater than 0V would therefore indicate the presence of a motor winding fault in one or more of windings 207 and 208. For example, if the low voltage power supplies 222, 223, 224 each supply a voltage of approximately 20V (i.e. LV Vout=20V), the expected measured voltage on the DC link in the presence of a winding fault may be 30-40V (i.e. 2×LV Vout).

The voltage diagnostic unit 250 may comprise a voltage sensor for measuring the potential difference between the rails 201 and 203.

If the voltage diagnostic unit 250 detects a motor winding fault, it can send a signal indicating a motor winding fault to the controller. In response to receiving a signal indicating a motor winding fault, the controller may prevent the battery 202 from being connected to the inverter 204, for example by keeping the contacts 205 open.

Different pairs of motor windings can be checked for faults in a similar way by closing different pairs of switches. For example, by closing switches 212 and 215 (keeping the remaining switches open) and measuring the DC link voltage at unit 250, faults in one or more of windings 208 and 209 can be determined. By closing switches 210 and 215 (keeping the other switches open) and measuring the DC link voltage at unit 250, faults in one or more of windings 207 and 209 can be determined.

By closing two different pairs of switches sequentially as described above, all three of the windings 207, 208, 209 in the three-phase motor 206 can be tested.

If none of the above sequence of tests results in the detection of a connection fault, it can be deduced that the windings are properly connected. In this case, the controller may output a signal to close the contacts 205 to connect the battery 202 to the inverter 204.

Therefore, each winding in the motor is connected to (i.e. part of an electrical path comprising) two switches: a respective first switch and a respective second switch. For a respective winding of the motor, the respective first switch is one of a first subset of switches of the inverter and the respective second switch is one of a second subset of switches of the inverter.

By closing a pair of switches of the multiple switches of the inverter comprising one switch of the first subset of switches and one switch of the second subset of switches, where the one switch if the first subset and the one switch of the second subset are connected to different (i.e. separate) windings of the motor (in other words, the switch in the first subset and the switch in the second subset are not connected to the same winding of the motor—that is, the switch in the first subset is connected to one winding and the switch in the second subset is connected to a different winding) and measuring the voltage across the DC link between the high voltage power supply (battery 202) and the motor 206, the presence of a fault in one or more of the windings connected to the one switch in the first subset and the one switch in the second subset can be determined.

The test can then be repeated by closing a different pair of switches, wherein at least one of the different pair of switches is a different switch to the one of the first subset of switches or the second subset of switches used in the previous test and wherein each switch of the different pair of switches is connected to a different (i.e. separate) winding of the motor.

If the voltage diagnostic unit 250 does not detect a fault in either of these tests, this can confirm that there are no winding faults in the three-phase motor.

If one or more of these two tests indicates a fault in one or more of the windings, further tests can be performed using different combinations of switches to determine which winding is affected. For example, if a test is performed where the pair of switches 210 and 213 are closed, such that a current flows through windings 207 and 208, and voltage diagnostic unit detects a voltage of greater than 0V (indicating a fault in one or more of the windings 207 and 208) further tests can be performed to close pairs of switches that allow a current to flow through windings 208 and 209, and then 207 and 209, to determine which of windings 207, 208 and 209 is faulty.

In the example shown in FIG. 2, the pair of switches 210 and 213 can be closed simultaneously to test windings 207 and 208 in a first test. In a second test, after opening all of the switched to charge capacitor 237, switches 210 and 215 can be closed simultaneously to test windings 207 and 209. If unit 250 detects a voltage of 0V for both of these tests, this can confirm that windings 207-209 are properly connected. If one or more of these tests indicates a winding fault, a further test can be performed by, after opening the switches to charge capacitor 237, close switches 213 and 215 simultaneously to test windings 208 and 209. The voltages measured by unit 250 for each of these three tests can be used to determine which windings in the three-phase motor 206 have connection faults.

Therefore, pairs of switches of the inverter can be closed in a non-torque producing pattern which collapses the LV voltage to 0V if the windings of the motor are properly connected. A fault in the windings can be detected if a voltage having an absolute value (or modulus) of greater than 0V is measured.

Pairs of windings of a three-phase motor may therefore be tested in turn by closing a pair of the switches to create a current path through two of the windings at a time, while keeping the remaining switches open.

The above tests can be performed in any order. It may be desirable to check for isolation faults using unit 240 before checking for motor winding faults using unit 250. Therefore, the controller may be configured to send a request to isolation unit 240 to detect whether there is an isolation fault before the gate drivers of pairs of switches are driven and the voltage on the DC link is monitored at unit 250 to detect the presence of a fault in one or more windings of the motor. If a fault is detected at one or more of isolation unit 240 and voltage diagnostic unit 250, the controller of the inverter may be configured to prevent the battery 202 from being connected to the inverter 204, for example by keeping the contacts 205 open. The electrical path through the inverter circuit will vary depending on which switches are open and which are closed.

This approach can be used as a start-up self-test usable for functional safety diagnostics. The above tests may be performed before applying a high voltage to the inverter by closing the battery contacts 108, 205. The above tests may run automatically every time the vehicle is started by a user. Performance of the above tests for all three of the windings may take approximately 100 ms. The diagnostics used could be either one shot or used for continuous or periodic monitoring.

The controller can be configured to, if the analysis of the voltage by diagnostic unit 250 or the unit 240 indicates a fault, not close the battery contacts 108, 205 between the battery and inverter. This prevents the high voltage from the battery being supplied to the motor via the inverter. The controller can be configured to, if the diagnostics from unit 240 and/or unit 250 do not indicate a fault, close the battery contacts 108 205 between the battery and inverter, thus allowing the high voltage from the battery to be supplied to the motor via the inverter to power the vehicle.

Figure 3:
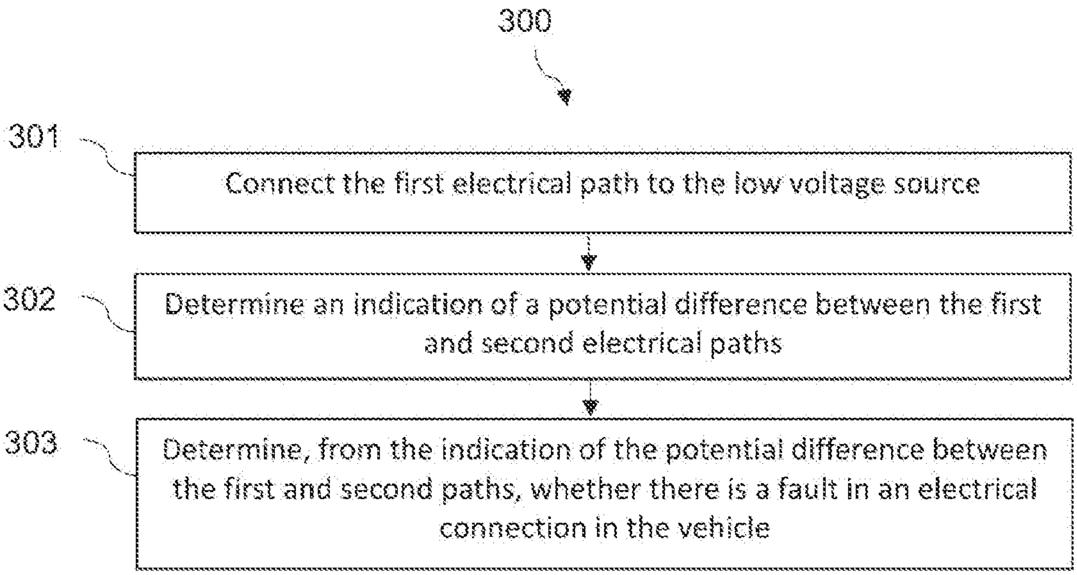
FIG. 3 shows the steps of an exemplary method for controlling a power inverter in an electric drive train.

FIG. 3 depicts a method 300 of controlling a power inverter in an electric drive train in accordance with embodiments of the present invention. The power inverter comprises a first electrical path connectable to a high voltage source and a low voltage source and a second electrical path that is connectable to the first electrical path and also capable of being electrically isolated from the first electrical path. At step 301, the method comprises connecting the first electrical path to the low voltage source. At step 302, the method comprises determining an indication of a potential difference between the first and second electrical paths. At step 303, the method comprises determining, from the indication of the potential difference between the first and second paths, whether there is a fault in an electrical connection in the vehicle. The fault may be, for example, an isolation fault or a fault in a winding of a motor. The second electrical path may vary depending on the configuration of one or more switching devices of the power inverter and/or on the type of fault (if present) The power inverter can be configured to perform these steps when the first electrical path is not connected to the high voltage source. These steps may, in some implementations, be performed by a controller of the power inverter which is configured to control various components of the power inverter.

Figure 4:
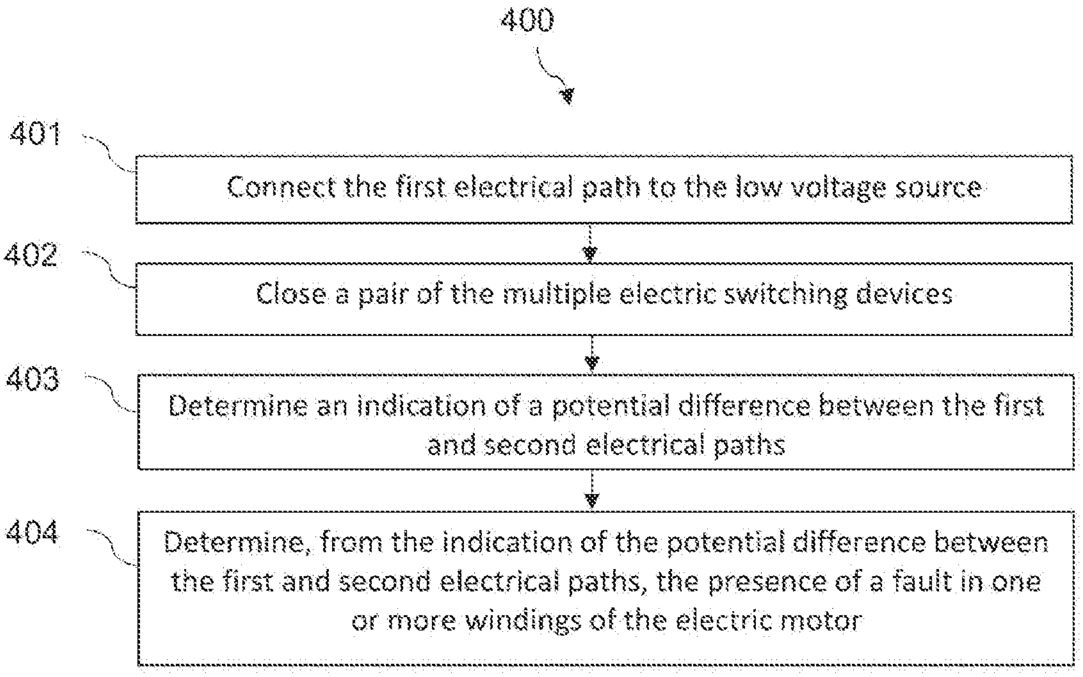
FIG. 4 shows the steps of another exemplary method for controlling a power inverter in an electric drive train.

FIG. 4 depicts another method 400 of controlling a power inverter in an electric drive train in accordance with embodiments of the present invention. As described above, the power inverter comprises multiple electric switching devices (such as MOSFETs) each connectable to a winding of the electric motor. The power inverter is configured to perform the following steps. The power inverter can be configured to perform these steps when the first electrical path is not connected to the high voltage source. These steps may, in some implementations, be performed by a controller of the power inverter which is configured to control various components of the power inverter.

At step 401, the method comprises connecting the first electrical path to the low voltage source. At step 402, the method comprises closing a pair of the multiple electric switching devices. At step 403, the method comprises determining an indication of a potential difference between the first and second electrical paths. At step 404, the method comprises determining, from the indication of the potential difference between the first and second electrical paths, the presence of a fault in one or more windings of the electric motor.

The above methods may be performed independently or sequentially.

The above steps may be performed prior to application of the HV voltage from the battery to the inverter (for example, before the battery contacts 108, 205 are closed to electrically connect the high voltage battery with the inverter via the rail 203) or after application of the HV voltage to the inverter (i.e. after the battery contacts 108, 205 have been closed) but prior to motor use.

The approach described herein can allow for the detection of an isolation fault in the drive train before the high voltage power supply is connected. It can also be used for early detection of faults in the motor and the connections in the electric drive train prior to a HV power supply being connected and/or used. For example, whether or not a motor is electrically connected to the inverter or whether there is a fault in one or more windings of the motor. This may reduce the exposure of a driver of the vehicle to a potentially dangerous fault.

The functions of a controller suitable for controlling an electric motor as described herein can be realized in digital electronic circuitry, integrated circuitry, specially designed application specific integrated circuits (ASICs), field programmable gate arrays (FPGAs) computer hardware, firmware, software, and/or combinations thereof.

These various aspects or features can include implementation in one or more computer programs that are executable and/or interpretable on a programmable system including at least one programmable processor such as a microprocessor, which can be special or general purpose, coupled to receive data and instructions from, and to transmit data and instructions to storage devices such as sticks and devices on a vehicle. Such computer programs, which can be software, software applications, applications, components, or code, include machine instructions for a programmable processor forming part of or associated with the controller, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor and which can receive instructions as a machine-readable signal. Such a machine-readable medium can store instructions transitorily or non-transitorily.

The applicant hereby discloses in isolation each individual feature described herein and any combination of two or more such features, to the extent that such features of combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A power inverter for an electric drive train of a vehicle, comprising:

a first electrical path comprising a contact connectable to a high voltage source and multiple electric switching devices connectable to a low voltage source;

a second electrical path comprising the multiple electric switching devices that are connectable to the first electrical path and also provide electric isolation from the first electrical path; and a test unit configured to determine an indication of a potential difference between the first and second electrical paths;

the power inverter being configured to have two modes of operation:

an operational mode in which the first electrical path is connected to the high voltage source by the contact being closed and the power inverter is configured to provide current to an electric motor of the vehicle; and a test mode in which the first electrical path is connected to the low voltage source by one or more of the multiple electric switching devices being closed and the test unit is configured to determine, from the indication of the potential difference between the first and second electrical paths, whether there is a fault in an electrical connection in the vehicle.

2. The power inverter as claimed in claim 1, wherein, in the test mode, the first electrical path is not connected to the high voltage source by the contact being open.

3. The power inverter as claimed in claim 1, wherein the power inverter is configured to, if the test unit determines, in the test mode, that there is not a fault in an electrical connection in the vehicle, connect the first electrical path to the high voltage source by the contact being closed.

4. The power inverter as claimed in claim 1, wherein the test unit is configured to determine, from the indication of the potential difference between the first and second electrical paths, whether the first and second electrical paths are electrically isolated from each other, and optionally wherein the fault is an isolation fault between one or more components of the vehicle powered by the high voltage source and one or more components of the vehicle powered by the low voltage source.

5. The power inverter as claimed in claim 1, wherein the test unit comprises a current sensor and wherein the test unit is configured to determine an indication of a potential difference between the first and second electrical paths by measuring current flow in one or both of the first and second electrical paths.

6. The power inverter as claimed in claim 1, wherein the power inverter further comprises the electric motor, and wherein the electric motor comprises multiple windings and wherein the multiple electric switching devices each are connectable to a winding of the electric motor.

7. The power inverter as claimed in claim 6, wherein in the test mode, each of the multiple electric switching devices is in an open configuration, or wherein the power inverter is configured to, in the test mode:

close a pair of the multiple electric switching devices;

determine an indication of a potential difference between the first and second electrical paths; and determine, from the indication of the potential difference between the first and second electrical paths, the presence of a fault in one or more windings of the electric motor.

8. The power inverter as claimed in claim 7, wherein the power inverter is configured to keep the other electric switching devices of the multiple electric switching device in an open configuration when the pair of the multiple electric switching devices are closed.

9. The power inverter as claimed in claim 7, wherein the power inverter is further configured to, in the test mode:

open the pair of switches;

close a different pair of the multiple electric switching devices to the pair of the multiple electric switching devices;

determine an indication of a potential difference between the first and second electrical paths; and determine, from the indication of the potential difference between the first and second electrical paths, the presence of a fault in one or more windings of the electric motor.

10. The power inverter as claimed in claim 9, wherein for a respective winding of the motor, the respective first switch is one of the first subset of switches and the respective second switch is one of the second subset of switches and wherein at least one of the different pair of the multiple electric switching devices is a different electric switching device to the one switch of the first subset of switches and/or the one switch of the second subset of switches.

11. The power inverter as claimed in claim 6, wherein each winding of the motor is connectable to a respective first switch and a respective second switch of the multiple electric switching devices.

12. The power inverter as claimed in claim 11, wherein the multiple electric switching devices comprise a first subset of switches and a second subset of switches.

13. The power inverter as claimed in claim 12, wherein for a respective winding of the motor, the respective first switch is one of the first subset of switches and the respective second switch is one of the second subset of switches, and/or wherein the pair of switches comprises one switch of the first subset of switches and one switch of the second subset of switches.

14. The power inverter as claimed in claim 13, wherein the one switch of the first subset of switches is connected to a first winding of the electric motor and the one switch of the second subset of switches is connected to a second winding of the electric motor.

15. The power inverter as claimed in claim 14, wherein the fault is a fault in one or more of the first winding and the second winding.

16. The power inverter as claimed in claim 6, wherein the power inverter is configured to, if the test unit determines the presence of a fault in one or more windings of the motor, prevent the connection of the first electric path to the high voltage electric energy store by the contact being open.

17. The power inverter as claimed in claim 1, wherein the power inverter comprises multiple gate drivers, each gate driver being configured to drive a respective electric switching device of the multiple electric switching devices, and/or wherein the test unit comprises a sensor configured to measure the potential difference between the first and second electrical paths.

18. The power inverter as claimed in claim 1, wherein the high voltage electric energy store is configured to supply a voltage of greater than 60 V, and/or wherein the low voltage source is configured to supply a voltage of less than 60 V.

19. A vehicle comprising the low voltage source, the electric motor, the high voltage source and the power inverter as claimed in claim 1.

20. A method of controlling a power inverter in an electric drive train of a vehicle, the power inverter comprising a first electrical path comprising a contact connectable to a high voltage source and multiple electric switching devices connectable to a low voltage source, a second electrical path comprising the multiple electric switching devices that are connectable to the first electrical path and also providing electric isolation from the first electrical path, and a test unit configured to determine an indication of a potential difference between the first and second electrical paths, the method comprising:

connecting the first electrical path to the low voltage source by one or more of the multiple electric switching devices being closed;

the test unit determining an indication of a potential difference between the first and second electrical paths; and the test unit determining, from the indication of the potential difference between the first and second paths, whether there is a fault in an electrical connection in the vehicle.

* * * * *